(12) United States Patent
Sugiyama et al.

(10) Patent No.: US 8,541,685 B2
(45) Date of Patent: Sep. 24, 2013

(54) FLEXIBLE HARNESS AND ELECTRICAL CONNECTOR CABLE USING SAME

(75) Inventors: Takahiro Sugiyama, Hitachi (JP); Hideki Nounen, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 200 days.

(21) Appl. No.: 12/869,184

(22) Filed: Aug. 26, 2010

(65) Prior Publication Data

US 2011/0051381 A1 Mar. 3, 2011

(30) Foreign Application Priority Data

Aug. 27, 2009 (JP) ................................ 2009-196538

(51) Int. Cl.
*H05K 1/00* (2006.01)
*H05K 7/12* (2006.01)

(52) U.S. Cl.
USPC ............................ 174/254; 361/749; 361/771

(58) Field of Classification Search
USPC ............................ 361/749–751, 771; 174/254
See application file for complete search history.

(56) References Cited

U.S. PATENT DOCUMENTS

| | | | | |
|---|---|---|---|---|
| 4,748,293 A | * | 5/1988 | Kikuchi et al. | 174/268 |
| 4,937,707 A | * | 6/1990 | McBride et al. | 361/751 |
| 6,369,331 B1 | * | 4/2002 | Kusano et al. | 174/260 |
| 6,559,389 B1 | * | 5/2003 | Kornrumpf et al. | 174/254 |
| 7,624,501 B2 | * | 12/2009 | Machida | 29/846 |
| 8,106,304 B2 | * | 1/2012 | Hashimoto | 174/254 |
| 2003/0067313 A1 | * | 4/2003 | Toyoshima et al. | 324/754 |
| 2006/0102386 A1 | * | 5/2006 | Morimoto et al. | 174/260 |
| 2007/0023203 A1 | * | 2/2007 | Leizerovich et al. | 174/255 |
| 2010/0147574 A1 | * | 6/2010 | Kaneko et al. | 174/261 |

FOREIGN PATENT DOCUMENTS

| | | | |
|---|---|---|---|
| JP | 60049652 A | * | 3/1985 |
| JP | 60-131974 | | 9/1985 |
| JP | 06-068940 | | 3/1994 |
| JP | 11-031543 | | 2/1999 |

OTHER PUBLICATIONS

Communication mailed Oct. 30, 2012, in connection with Japanese Patent Application No. 2009-196538, 2 pages, Japanese Patent Office, Japan.

* cited by examiner

*Primary Examiner* — Zachary M Pape
(74) *Attorney, Agent, or Firm* — Antonelli, Terry, Stout & Kraus, LLP.

(57) ABSTRACT

There is provided a flexible harness adapted to be detachably connected to electrode pads of an electric/electronic component. The flexible harness according to the present invention comprises: a flexible insulator film; a conductor pattern formed on the flexible insulator film; a terminal plane which is an end region of the conductor pattern; and ball-like contact bumps formed on the terminal plane. Each contact bump includes a core made of an elastically deformable resin and an electrical conductor layer surrounding the core.

17 Claims, 11 Drawing Sheets

(a)
BEFORE CONNECTION (b)
AFTER CONNECTION

(a) BEFORE CONNECTION (b) AFTER CONNECTION

FLEXIBLE HARNESS AND ELECTRICAL CONNECTOR CABLE USING SAME

CLAIM OF PRIORITY

The present application claims priority from Japanese patent application serial no. 2009-196538 filed on Aug. 27, 2009, the content of which is hereby incorporated by reference into this application.

BACKGROUND OF THE INVENTION

1. Field of the Invention

The present invention relates to flexible harnesses composed of a flexible printed circuit board (which is an insulator film on that a conductor pattern is formed). The invention particularly relates to detachable flexible harnesses and electrical connector cables using such a flexible harness used for connection between various electric/electronic components such as printed circuit boards and IC (integrated circuit) chips.

2. Description of Related Art

Flexible harnesses are often used for electrical connection between various electric/electronic components such as printed circuit boards and IC chips. Flexible harnesses are composed of a flexible printed circuit board (which is a flexible insulator film on that a conductor pattern is formed). End terminals of the conductor pattern are electrically connected to electrode pads of an electric/electronic component. Thus, electrical connection between various electric/electronic components is provided. The flexible harnesses are detachable and, therefore, have advantages that exchange of electric/electronic components (such as components mounted on a device) and electric/electronic devices (such as peripherals) is simplified, and also assembly of the electric/electronic apparatuses is facilitated.

In connecting a flexible harness to an electric/electronic component, it is important to provide stable physical contact and electrical connection between terminal ends of the conductor lines of the conductor pattern of the flexible harness and the electrode pads of the electric/electronic component. So, usually, the electric/electronic component (to which a flexible harness is to be connected) is provided with a receptacle (or a female connector) for fitting together the end terminals of the conductor lines of the flexible harness.

An example of such a receptacle is reported in, e.g., JP-A Hei 6(1994)-68940, in which multiple spring conductors (which are metal electrodes formed by molding or the like) are fitted in a plastic cover, and are electrically connected to a component such as a printed circuit board and an IC chip. When a flexible harness is fitted into such a receptacle, the spring conductors fit together with the end terminals of the conductor lines of the flexible harness.

Another example of such a receptacle type connector is reported in, e.g., JP-A Hei 11(1697)-31543, in which an insulator member having a protrusion covered with a conductor is formed in the receptacle, and a member having a recession (which is covered with a conductor and can receive the protrusion formed in the receptacle) is formed in the connector of the flexible harness. With this structure, electrical contact is provided by fitting the protrusion into the recession.

In some flexible harnesses, the end terminals of the conductor lines of the flexible harness are backed by a reinforcing rigid plate in order to resist the force exerted by the electrodes of a receptacle to the end terminals.

Electronic components such as IC chips are continually being downsized. Also, the number of pins on such electronic components continues to rise, and as a result the pin pitch continues to decrease. As described above, conventional receptacles are configured by, for example, fitting multiple resilient conductor electrodes in a plastic cover. However, it is difficult to downsize such conventional receptacles or increase the number of electrode pins in such conventional receptacles. In particular, for devices having a pin array of multiple rows and columns (such as a pin grid array and a land grid array), it is even more difficult to form a receptacle having an array of multiple resilient conductors. Even if the formation of such a receptacle having a resilient electrode array is possible, its manufacturing cost will be unacceptably high.

A possible solution to the above problems is to force end terminals of the conductor lines of the flexible harness to directly contact the electrode pads of an electric/electronic component without using a receptacle. However, the end terminals of the conductor lines of the flexible harness do not have spring properties and, therefore, it is difficult to evenly apply sufficient contact force to all the contact points. For example, when there is even a slight difference among the heights of the electrode pads of the electric/electronic component, then stable and reliable electrical connection may not be established at some of the contact points. For another example, when a printed circuit board (to which a flexible harness is to be connected) warps, electrical connection may not be established at many of the contact points between the flexible harness and the printed circuit board because the end terminals of the flexible harness do not have spring properties.

SUMMARY OF THE INVENTION

In view of the foregoing, it is an objective of the present invention to provide a detachable flexible harness, in which stable electrical contact can be established between end terminals of the conductor lines of the flexible harness and the electrode pads of an electric/electronic component without the need for mounting a conventional receptacle to the electric/electronic component. It is another objective of the invention to provide an electrical connector cable using the flexible harness of the invention. It is still another objective of the invention to provide a method for connecting the electrical connector cable to an electric/electronic component.

(1) According to one aspect of the present invention, there is provided a flexible harness for detachable connection to electrode pads of an electric/electronic component, the flexible harness comprising:

a flexible insulator film; a conductor pattern formed on the flexible insulator film; a terminal plane which is an end region of the conductor pattern; and ball-like contact bumps formed on the terminal plane, each contact bump including a core made of an elastically deformable resin and an electrical conductor layer surrounding the core.

In the above aspect (1) of the present invention, the following modifications and changes can be made.

(i) The contact bumps are fixed to the terminal plane by soldering.

(ii) The conductor pattern includes: a plurality of signal lines formed on one surface of the insulator film, the plurality of signal lines being adapted to be electrically connected to the electrode pads of the electric/electronic component; and a ground line formed on the other surface of the insulator film.

(iii) The electrical conductor layer comprises a plurality of layers.

(iv) The resin of the core is a thermosetting phenol resin.

(v) There is provided a module including a plurality of electric/electronic components electrically connected to one another via the flexible harness of the invention.

(2) According to another aspect of the present invention, there is provided an electrical connector cable for detachable connection to electrode pads of an electric/electronic component, the electrical connector cable comprising:

a flexible harness including:

a flexible insulator film; a conductor pattern formed on the flexible insulator film; a terminal plane which is an end region of the conductor pattern; and ball-like contact bumps formed on the terminal plane, each contact bump including a core made of an elastically deformable resin and an electrical conductor layer surrounding the core;

a first sheet disposed adjacent to the surface of the insulator film opposite the surface including the terminal plane, the first sheet being made of an elastic material with a low modulus of elasticity;

a first plate which is deposed over the first sheet and is for pushing together the first sheet and the terminal plane against the electrode pads, the first plate being made of a rigid material with a high modulus of elasticity; and a fastening jig for fastening together the first plate, the first sheet, the contact bumps on the terminal plane, and the electrode pads on the electric/electronic component.

In the above aspect (2) of the present invention, the following modifications and changes can be made.

(vi) The electrical connector cable further comprises:

a second sheet disposed adjacent to the surface of the electric/electronic component opposite the surface including the electrode pads, the second sheet being made of an elastic material with a low modulus of elasticity; and a second plate for pushing together the second sheet and the electrode pads against the terminal plane, the second plate being made of a rigid material with a high modulus of elasticity.

(vii) At least one of the first plate and the second plate is a leaf spring.

(viii) The electrical connector cable further comprises an alignment plate for aligning the contact bumps with the electrode pads.

(ix) There is provided a module including a plurality of electric/electronic components electrically connected to one another via the electrical connector cable of the invention.

(3) According to still another aspect of the present invention, there is provided a method for detachably connecting a wire harness electrically with electrode pads of an electric/electronic component, the method including the steps of:

using, as the wire harness, a flexible harness, the flexible harness including: a flexible insulator film; a conductor pattern formed on the flexible insulator film; a terminal plane which is an end region of the conductor pattern; and ball-like contact bumps formed on the terminal plane; each contact bump including a core made of an elastically deformable resin and an electrical conductor layer surrounding the core;

disposing a first sheet adjacent to the surface of the insulator film opposite the surface including the terminal plane, the first sheet being made of an elastic material with a low modulus of elasticity;

disposing a first plate over the first sheet, the first plate being made of a rigid material with a high modulus of elasticity; and pushing together the first plate, the first sheet, and the terminal plane on the insulator film toward the electrode pads on the electric/electronic component in order to force the contact bumps to contact the electrode pads.

In the above aspect (3) of the present invention, the following modifications and changes can be made.

(x) The method further comprises the steps of:

disposing a second sheet adjacent to the surface of the electric/electronic component opposite the surface including the electrode pads, the second sheet being made of an elastic material with a low modulus of elasticity;

disposing a second plate over the second sheet, the second plate being made of a rigid material with a high modulus of elasticity; and pushing the second plate, the second sheet, and the electrode pads on the electric/electronic component toward the terminal plane in order to force the electrode pads to contact the contact bumps.

(xi) At least one of the first plate and the second plate is a leaf spring; and at least one of the first plate and the second plate is disposed to be bent inwardly toward the terminal plane and is pushed in such a manner as to be straightened after the pushing.

(xii) The method further comprises, before performing the pushing step, the steps of: disposing an alignment plate; and aligning the contact bumps with the electrode pads using the alignment plate.

ADVANTAGES OF THE INVENTION

The present invention can provide a detachable flexible harness, in which stable electrical contact is established between end terminals of the conductor lines of the flexible harness and the electrode pads of an electric/electronic component without the need for mounting a conventional receptacle to the electric/electronic component. The invention can also provide an electrical connector cable using the flexible harness of the invention. Furthermore, the invention can provide a method for connecting the electrical connector cable to an electric/electronic component.

DETAILED DESCRIPTION OF THE PREFERRED EMBODIMENTS

A preferred embodiment of the present invention will be described below with reference to the accompanying drawings. The invention is not limited to the specific embodiments described below, but various combinations and modifications are possible without departing from the principles of the invention. Like parts are designated by like reference numerals without repeating the description thereof.

First Embodiment of Present Invention

Configuration of Flexible Harness

Figure 1:
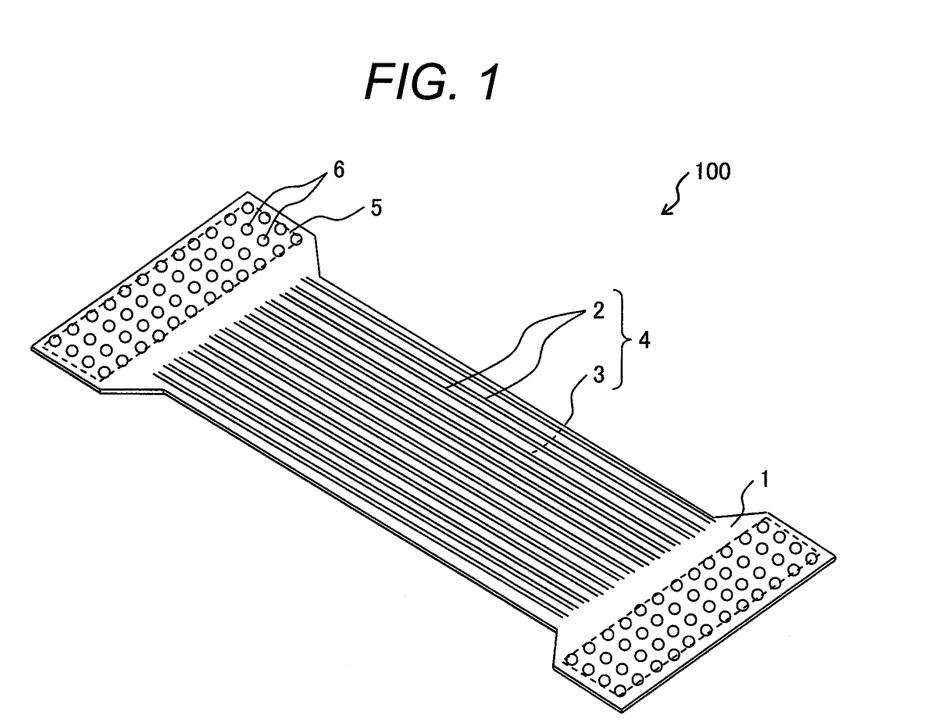
FIG. 1 is a schematic illustration showing a perspective view of an example of a flexible harness according to a first embodiment of the present invention.
Figure 2A:
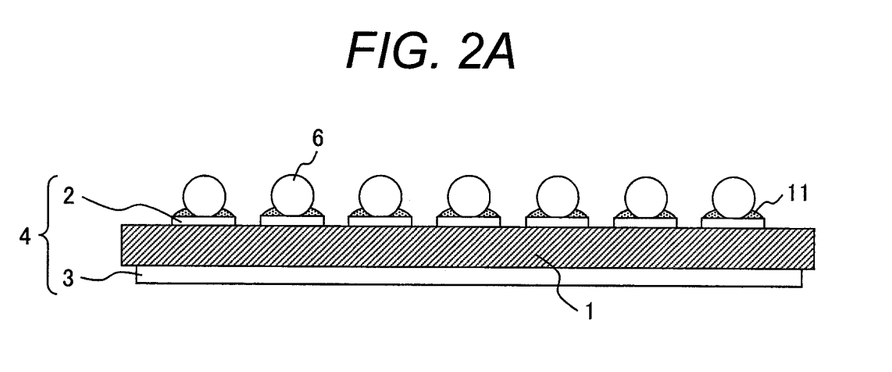
FIG. 2A is a schematic illustration showing a cross-sectional view of a terminal plane of the flexible harness shown in FIG. 1.

FIG. 1 is a schematic illustration showing a perspective view of an example of a flexible harness 100 according to a first embodiment of the present invention. FIG. 2A is a schematic illustration showing a cross-sectional view of a terminal plane 5 of the flexible harness 100 shown in FIG. 1, and FIG. 2B is a schematic illustration showing a cross-sectional view of an example of a contact bump 6.

Figure 2B:
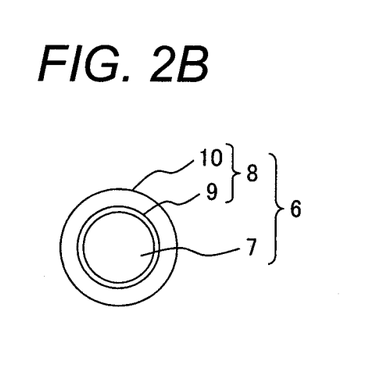
FIG. 2B is a schematic illustration showing a cross-sectional view of an example of a contact bump.

As illustrated in FIG. 1 and FIGS. 2A and 2B, the flexible harness 100 according to the first embodiment includes: a flexible insulator film 1; a conductor pattern 4 formed on a surface of the insulator film 1; a terminal plane 5 which is an end region of the conductor pattern 4; and multiple ball-like contact bumps 6 formed on the surface of the terminal plane 5. The flexible insulator film 1 is about a 25 to 50 µm thick film made of a polyimide-based resin or a liquid crystal polymer (LCP) used in conventional flexible printed circuit (FPC) boards.

Each contact bump 6 includes: a core 7 made of an elastically deformable resin; and an electrical conductor layer 8 surrounding the core 7 (see FIG. 2B). The core 7 is preferably made of, e.g., a thermosetting phenol resin and is 200 to 300 µm in diameter. The electrical conductor layer 8 preferably includes: about a 5 µm thick underlayer 9 (e.g., a nickel (Ni) layer); and, formed around the underlayer 9, about a 20 µm thick contact layer 10 (e.g., a gold (Au) layer) which is corrosion-resistant and highly electrically conductive. Thus, each contact bump 6 has a ball-like structure with a diameter of about 250 to 350 µm. By arranging multiple contact bumps 6 in an array of multiple columns and rows, a grid connector having a small pitch (e.g., 0.5 mm) is obtained. The shape of the contact bump 6 does not need to necessarily be a perfect sphere, but may be a spheroid, a polyhedron or a combination thereof having a diametrical dimension from 250 to 350 µm.

There is no particular limitation on the method for fixing the contact bumps 6 to the terminal plane 5 so long as reliable electrical connection between the contact bumps 6 and the conductor pattern 4 (or, more specifically, signal lines 2) can be assured. For instance, this fixing is preferably performed via a solder 11 (see FIG. 2A), because conventional manufacturing apparatuses (such as a ball mounter) can be used, and therefore the automation and cost reduction of the production of the flexible harness 100 can be achieved.

The conductor pattern 4 includes: formed on a surface of the flexible insulator film 1, the multiple signal lines 2 connected to the respective contact bumps 6; and a ground line 3 formed on the other surface of the insulator film 1 (see, e.g., FIG. 2A). The ground line 3 is not necessarily required. However, when high speed (high frequency) signals need to be transmitted, it is preferable to dispose the ground line 3 (e.g., a ground plane that nearly entirely covers one surface of the insulator film 1).

Figure 3:
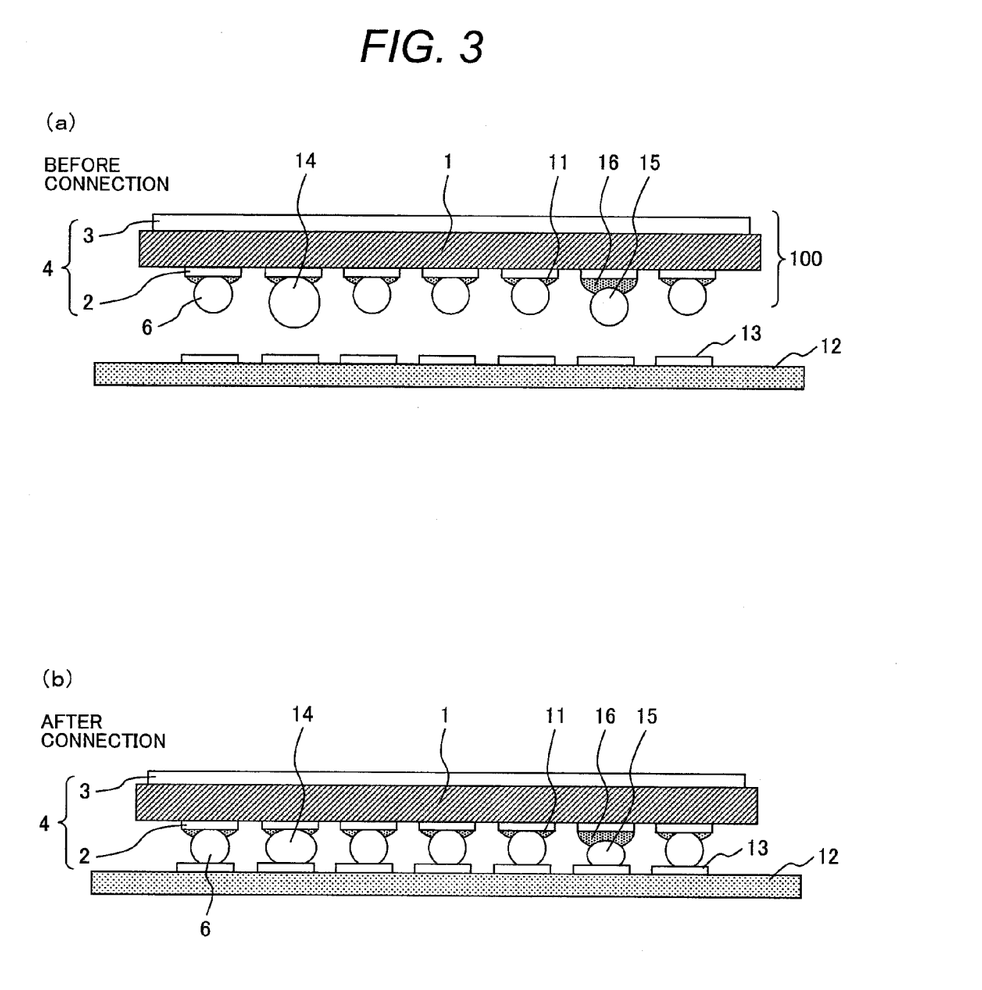
FIG. 3 is a schematic illustration showing cross-sectional views of an example of a method for connecting a flexible harness according to a first embodiment with the electrode pads of a printed circuit board, in which (a) is a view before the connection, and (b) is a view after the connection.

FIG. 3 is a schematic illustration showing cross-sectional views of an example of a method for connecting the flexible harness 100 of the first embodiment with electrode pads 13 of a printed circuit board 12, in which (a) is a view before the connection, and (b) is a view after the connection. As illustrated in FIG. 3(a), some of the contact bumps 6 may be larger than the others (such as the contact bump 14 in the figure) or some of the solders 11 may bulge out higher than the others (such as the solder 16 in the figure). As a result, when multiple contact bumps 6 are formed on the terminal plane 5 of the flexible harness 100, some contact bumps 6 may protrude higher than the others. As described above, the contact bumps 6, 14, and 15 have the core 7 made of an elastically deformable resin. Therefore, even if there is a difference among the heights (the amounts of protrusion from the signal lines 2) of the contact bumps 6, the elastic deformations of the contact bumps 14 and 15 absorbs such a height difference (i.e., the higher bumps 14 and 15 elastically contract so as to equalize the heights of all the contact bumps 6) when the contact bumps 6, 14, and 15 of the flexible harness 100 are forced to contact the electrode pads 13 of the printed circuit board 12 (see, FIG. 3(b)). Thus, the flexible harness 100 according to the first embodiment can provide reliable electrical contact with the printed circuit board 12.

When the core 7 of a contact bump 6 is made of a thermosetting phenol resin, the contact bump 6 can elastically deform in the radial direction by about 10%. For example, a contact bump 6 with a diameter of 300 µm can elastically deform (contract) in the radial direction by about 30 µm. In other words, the size of the contact bump 6 and the amount of solder deposited have a tolerance estimated from the maximum elastic deformation of the core 7. This increases the production yield of the flexible harness 100 and also increases the stability and reliability of the electrical connection with the printed circuit board 12, thus leading to overall cost reduction.

Second Embodiment of Present Invention

Configuration of Electrical Connector Cable

Figure 4:
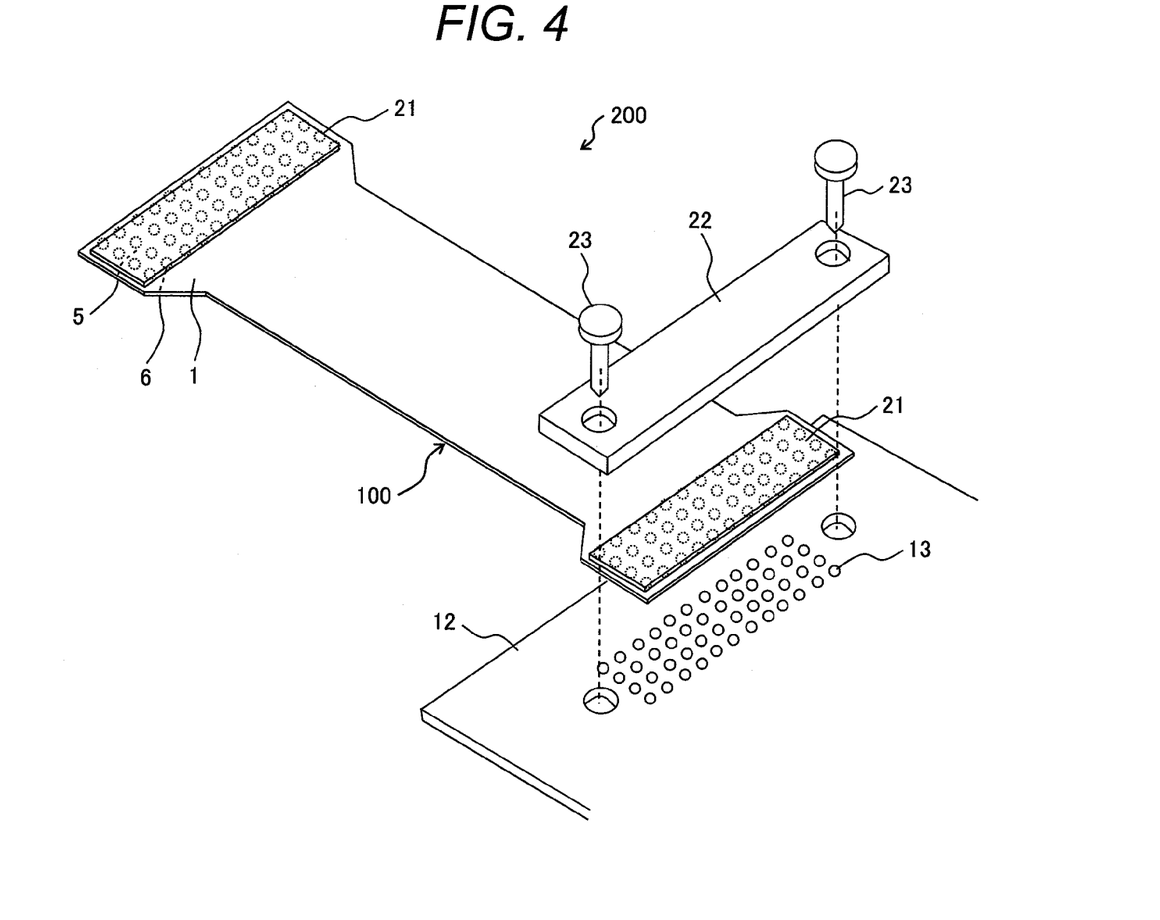
FIG. 4 is a schematic illustration showing a perspective view of an example of an electrical connector cable according to a second embodiment of the present invention, and of a method for connecting the electrical connector cable with a printed circuit board.

FIG. 4 is a schematic illustration showing a perspective view of an example of an electrical connector cable 200 according to a second embodiment of the present invention. FIG. 4 particularly illustrates a method for connecting the cable 200 with a printed circuit board 12. As illustrated, the electrical connector cable 200 includes: the flexible harness 100 according to the first embodiment; a first elastic (low elasticity modulus) sheet 21 disposed adjacent to the surface of the insulator film 1 of the flexible harness 100 opposite the surface having the terminal plane 5; a first rigid (high elasticity modulus) plate 22 for pushing together the first elastic sheet 21 and the terminal plane 5 toward the electrode pads 13 of the printed circuit board 12; and a fastening jig 23 for fastening together at least the four parts—the first rigid plate 22, the first elastic sheet 21, the contact bumps 6, and the electrode pads 13.

The method for electrically connecting the electrical connector cable 200 with the electrode pads of an electric/electronic component (the electrode pads 13 of the printed circuit board 12 in FIG. 4) includes the steps of: positioning the contact bumps 6 of the flexible harness 100 to face the electrode pads 13 on a one-to-one basis; pushing together the first rigid plate 22, the first elastic sheet 21 and the terminal plane 5 against the electrode pads 13; and fastening together the first rigid plate 22, the first elastic sheet 21, the terminal plane 5, and the printed circuit board 12 using a fastening jig 23.

The material for the first elastic sheet 21 is properly chosen in consideration of the force used to push the terminal plane 5 against the electrode pads 13 and the force used to fasten the necessary parts together. For example, silicone rubbers can be advantageously used. The material for the first rigid plate 22 is also properly chosen in consideration of the pushing force used and the fastening force used. For example, stainless steels and ceramics can be advantageously used. In addition, there is no particular limitation on the fastening jig 23, the pushing method, or the fastening method. For example, conventional techniques (such as screw fastening and bolt-and-nut fastening) can be used.

Figure 5A:
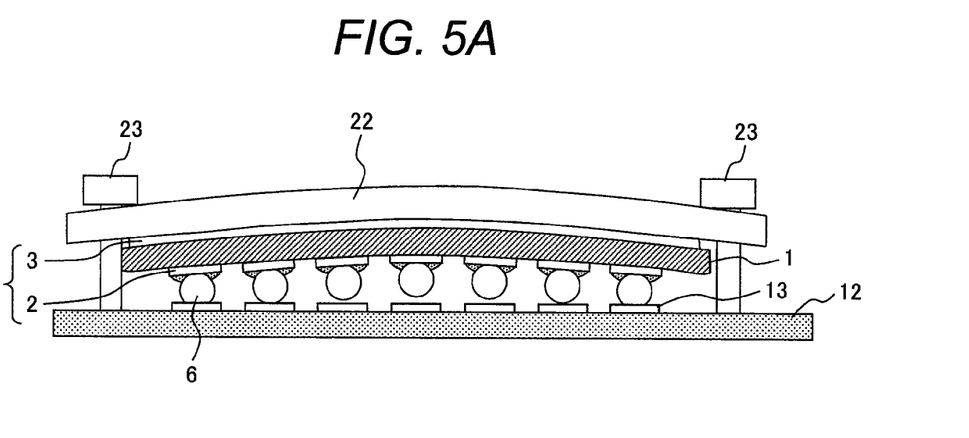
FIG. 5A is a schematic illustration showing a cross-sectional view depicting that, if used without an elastic sheet, a contact failure occurs between the electrical connector cable shown in FIG. 1 and the electrode pads of a printed circuit board.
Figure 5B:
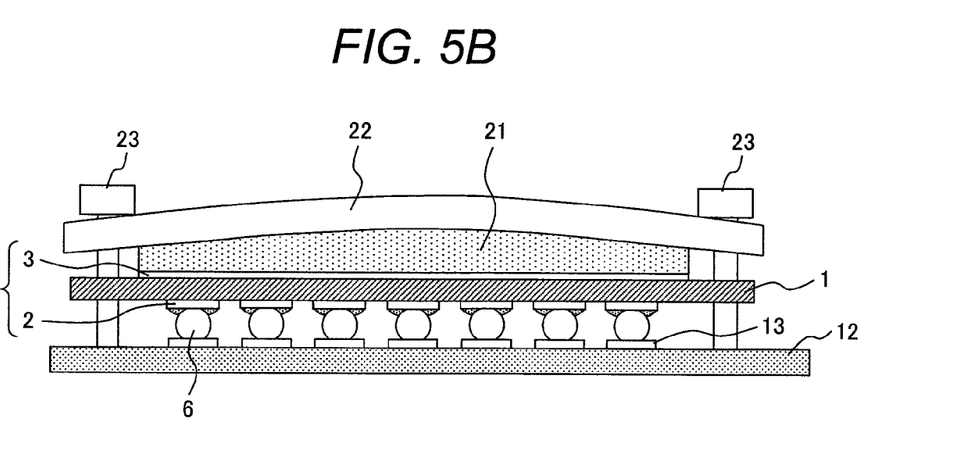
FIG. 5B is a schematic illustration showing a cross-sectional view depicting that the electrical connector cable shown in FIG. 4 makes successful contact with the electrode pads of a printed circuit board.

Next, the effects and advantages of the electrical connector cable 200 according to the second embodiment will be described. FIG. 5A is a schematic illustration showing a cross-sectional view depicting that, if used without the first elastic sheet 21, a contact failure occurs between the electrical connector cable 200 and the electrode pads 13 of the printed circuit board 12. FIG. 5B is a schematic illustration showing a cross-sectional view depicting that the electrical connector cable 200 shown in FIG. 4 makes successful contact with the electrode pads 13 of the printed circuit board 12.

When there are a large number of the contact bumps 6 (and therefore a large number of electrode pads 13), a very large force needs to be applied to the first rigid plate 22 with the fastening jig 23 in order to establish stable electrical connections at all the contact points between the contact bumps 6 and the electrode pads 13. For example, assuming that there are 400 contact points and, for each contact point, a force of 20 gf is required for stable electrical connection, then the first rigid plate 22 needs to be pushed with a total force of 8 kgf. In such a large load case, if the electrical connector cable 200 is not equipped with the first elastic sheet 21, the first rigid plate 22 may be bent by a possible bending moment, which may in turn bend the flexible harness 100. As a result of this bending, there is a possibility that electrical contact failures occur between some of the contact bumps 6 located in a middle portion of the terminal plane 5 and their respective counterpart electrode pads 13 (see FIG. 5A).

In contrast, the electrical connector cable 200 according to the second embodiment includes the first elastic sheet 21. In this configuration, as illustrated in FIG. 5B, the bending of the flexible insulator film 1 can be prevented because the bending force exerted by the first rigid plate 22 is absorbed by the elastic deformation of the first elastic sheet 21, and therefore stable electrical connection can be established at all the contact points. Thus, the electrical connector cable 200 according to the second embodiment is particularly advantageous when there is a large number of contact bumps 6 (and therefore a large number of electrode pads 13). Conversely, when there are a sufficiently small number of contact bumps 6 (electrode pads 13), i.e., the amount of bending of the first rigid plate 22 caused by a possible bending moment is sufficiently small, the first elastic sheet 21 may be removed.

Figure 6:
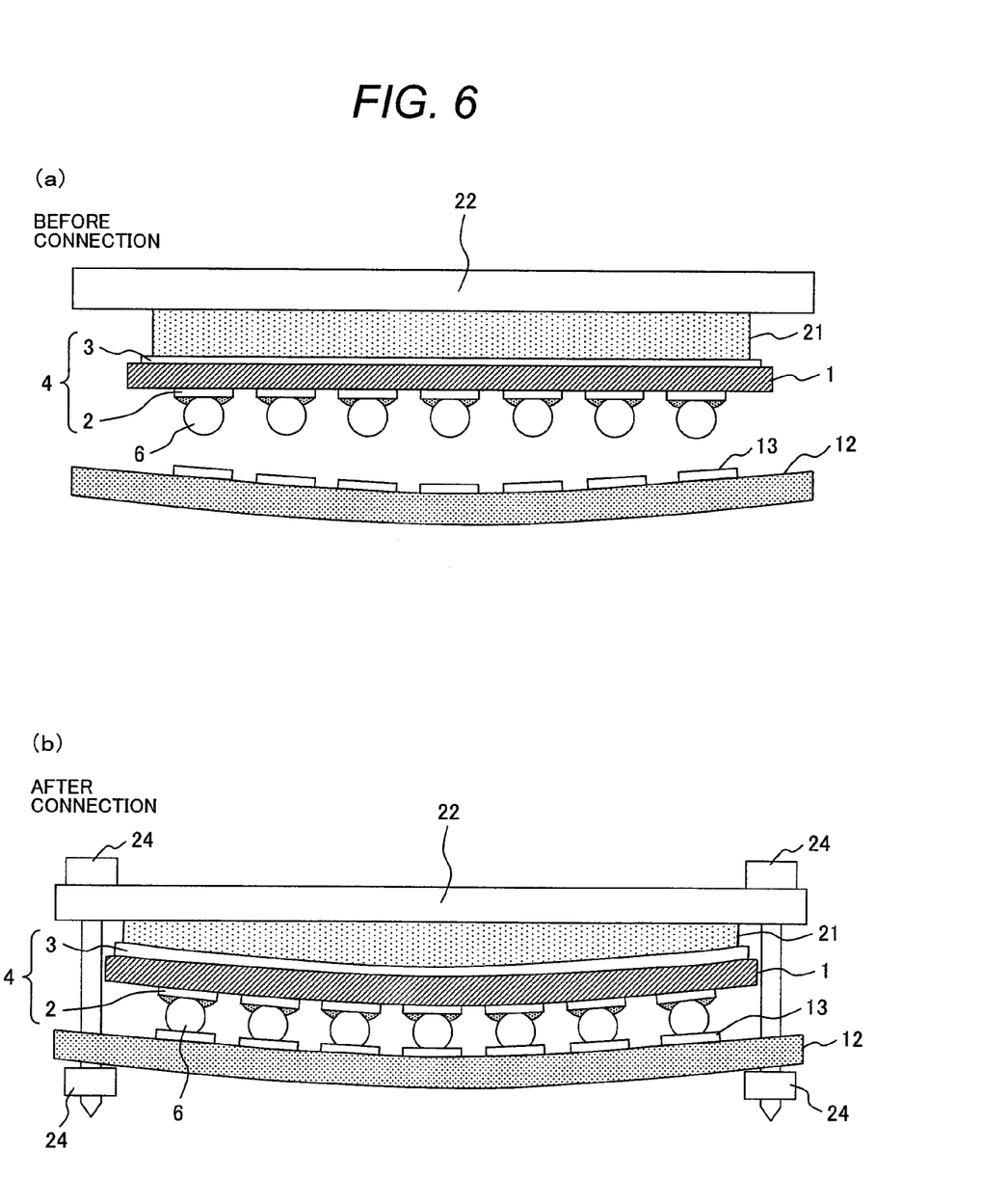
FIG. 6 is a schematic illustration showing cross-sectional views of another example of a method for connecting an electrical connector cable according to a second embodiment with the electrode pads of a printed circuit board, in which (a) is a view before the connection, and (b) is a view after the connection.

FIG. 6 is a schematic illustration showing cross-sectional views of another example of the method for connecting the electrical connector cable 200 according to the second embodiment with the electrode pads 13 of the printed circuit board 12, in which (a) is a view before the connection, and (b) is a view after the connection. An actual electric/electronic component may sometimes warp or bend (such as the printed circuit board 12 shown in FIG. 6(a)). Even in such a case, as illustrated in FIG. 6(b), the first elastic sheet 21 elastically deforms so as to cause the flexible insulator film 1 to conform to the shape of such a warped or bent printed circuit board 12. Thus, stable electrical connection can be established at all the contact points. In FIG. 6(b), a bolt and a nut are used as a fastening jig 24.

Third Embodiment of Present Invention

Configuration of Electrical Connector Cable

Figure 7:
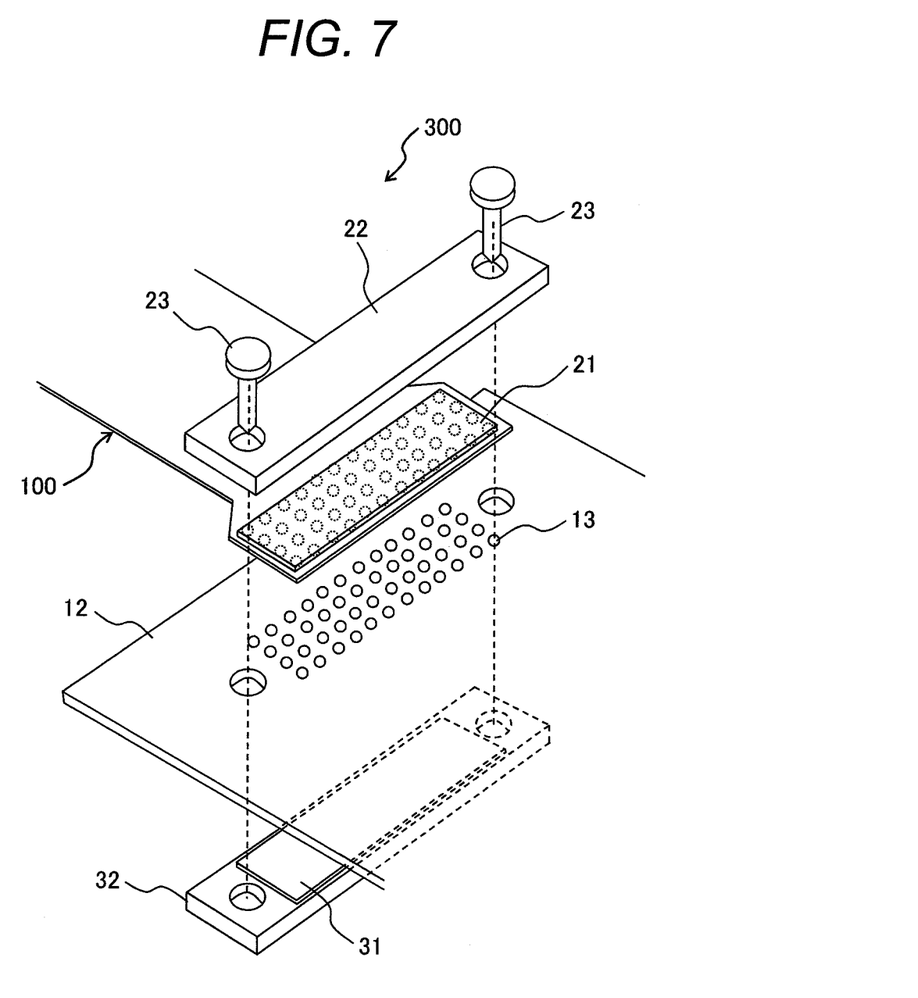
FIG. 7 is a schematic illustration showing a perspective view of an example of an electrical connector cable according to a third embodiment of the present invention, and of a method for connecting the electrical connector cable with a printed circuit board.

FIG. 7 is a schematic illustration showing a perspective view of an example of an electrical connector cable 300 according to a third embodiment of the present invention. FIG. 7 particularly illustrates a method for connecting the cable 300 with a printed circuit board 12. As illustrated, the electrical connector cable 300 according to the third embodiment includes, in addition to the electrical connector cable 200 according to the second embodiment: a second elastic sheet 31 disposed adjacent to the surface of the printed circuit board 12 opposite the surface having the electrode pads 13; and a second rigid plate 32 for pushing together the second elastic sheet 31 and the printed circuit board 12 toward the terminal plane 5.

The method for connecting the electrical connector cable 300 with the electrode pads of an electric/electronic component (the electrode pads 13 of the printed circuit board 12 in FIG. 7) includes the steps of: positioning the contact bumps 6 of the flexible harness 100 to face the electrode pads 13 on a one-to-one basis; pushing together the first rigid plate 22, the first elastic sheet 21 and the terminal plane 5 against the electrode pads 13 as well as pushing together the second rigid plate 32, the second elastic sheet 31 and the electrode pads 13 toward the terminal plane 5; and fastening all the necessary parts together with a fastening jig 23.

The materials for the second elastic sheet 31 and the second rigid plate 32 are properly chosen in the same manner as described above with respect to the choice of the materials for the first elastic sheet 21 and the first rigid plate 22 of the electrical connector cable 200 according to the second embodiment. The first elastic sheet 21 and the second elastic sheet 31 may be made of the same or a different material. The first rigid plate 22 and the second rigid plate 32 may also be made of the same or a different material.

Next, the effects and advantages of the electrical connector cable 300 according to the third embodiment will be described. As described above, the electrical connector cable 300 according to the third embodiment includes, in addition to the electrical connector cable 200 according to the second embodiment, the second elastic sheet 31 and the second rigid plate 32. With this configuration, the contact bumps 6 are forced to contact the electrode pads 13 by pushing together the first rigid plate 22, the first elastic sheet 21 and the terminal plane 5 toward the electrode pads 13 as well as pushing together the second rigid plate 32, the second elastic sheet 31 and the electrode pads 13 toward the terminal plane 5 and then fastening all necessary parts. Thus, contact failures between the contact bumps 6 and the electrode pads 13 can be more effectively prevented than in the second embodiment, and therefore a more stable and reliable electrical connection can be achieved. It is preferred that the electrical connector cable 300 according to the third embodiment is equipped with the first elastic sheet 21 and the second elastic sheet 31. However, when there are a sufficiently small number of contact bumps 6 (and therefore a sufficiently small number of electrode pads 13), i.e., the amounts of bending of the first rigid plate 22 and of the second rigid plate 32 caused by a possible bending moment are sufficiently small, the first elastic sheet 21 and the second elastic sheet 31 may be removed.

Figure 8:
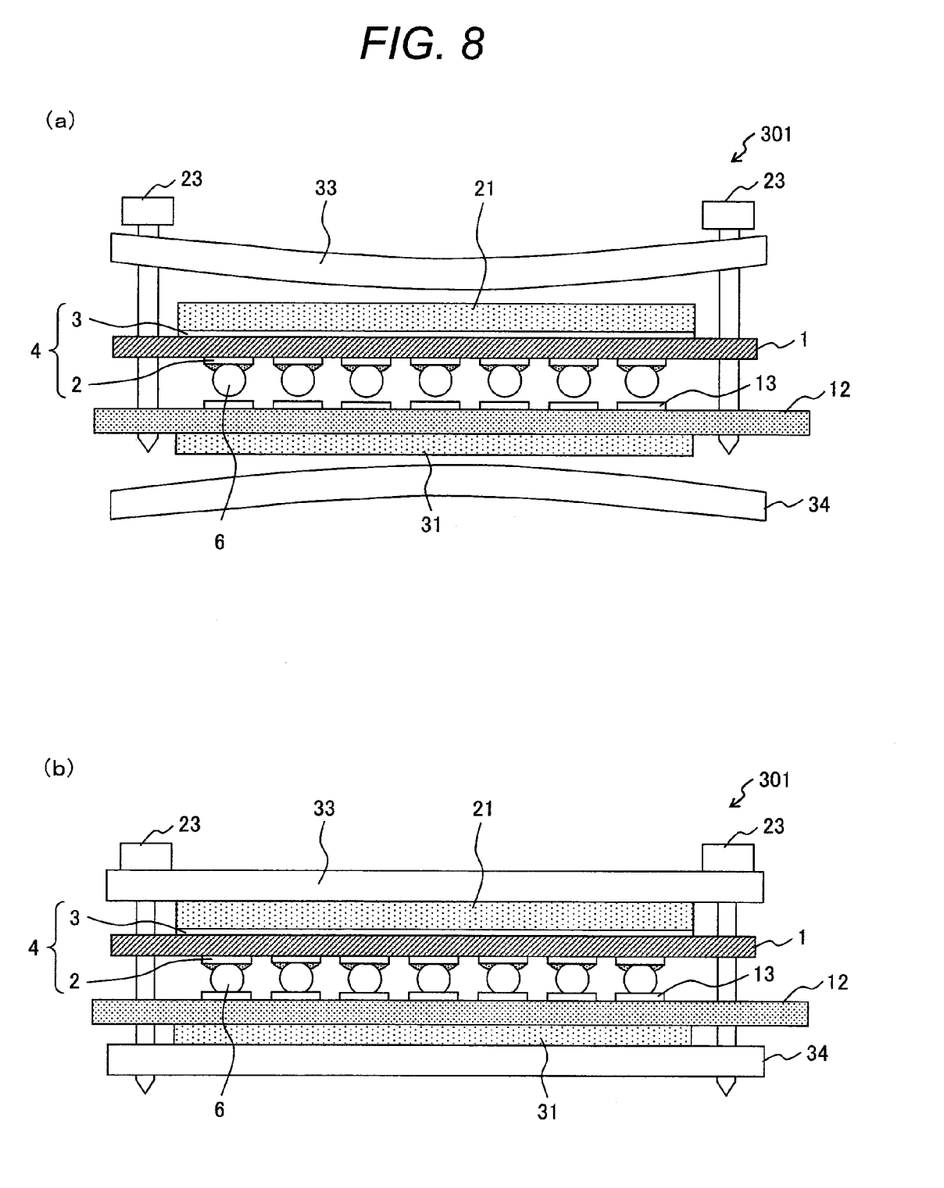
FIG. 8 is a schematic illustration showing cross-sectional views of an example of a method for connecting another electrical connector cable according to a third embodiment with the electrode pads of a printed circuit board, in which (a) is a view before the connection, and (b) is a view after the connection.

When there are a large number of contact bumps 6 (electrode pads 13), in order to more stably press the contact bumps 6 located in a middle portion of the terminal plane 5 against their respective counterpart electrode pads 13, it is more preferable that the first rigid plate 22 and/or the second rigid plate 32 are a leaf spring. FIG. 8 is a schematic illustration showing cross-sectional views of an example of a method for connecting another electrical connector cable 301 according to the third embodiment with the electrode pads 13 of the printed circuit board 12, in which (a) is a view before the connection, and (b) is a view after the connection.

As illustrated in FIG. 8, the electrical connector cable 301 differs from the above-described electrical connector cable 300 in that a first rigid plate 33 and a second rigid plate 34 used in the electrical connector cable 301 are a leaf spring. Before the connection, the first rigid plate 33 and the second rigid plate 34 are disposed to be bent inwardly toward the terminal plane 5 (see FIG. 8(a)). And then, the thus bent first rigid plate 33 and the second rigid plate 34 are pushed in such a manner so as to be straightened after the connection (see FIG. 8(b)). In this manner, the entire area of the terminal plane 5 is more evenly pressed against the printed circuit board 12, thus providing a more stable electrical connection.

Fourth Embodiment of Present Invention

Configuration of Electrical Connector Cable

Figure 9:
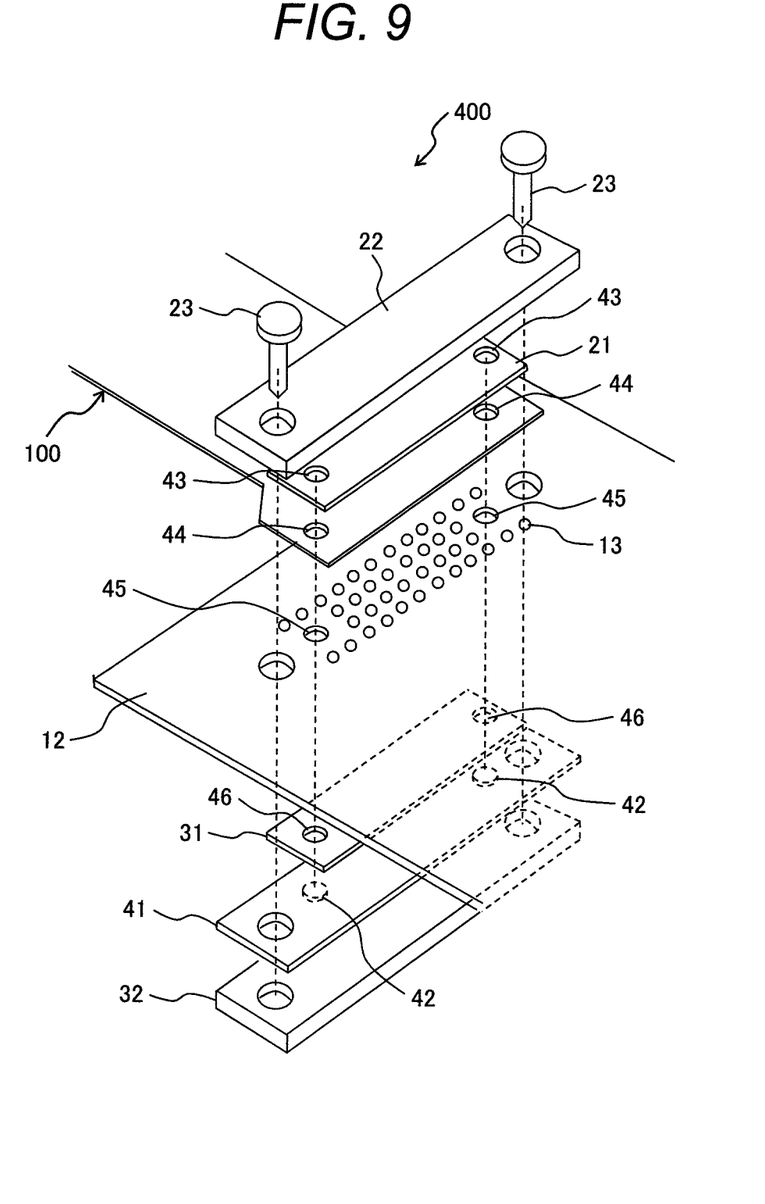
FIG. 9 is a schematic illustration showing a perspective view of an example of an electrical connector cable according to a fourth embodiment of the present invention, and of a method for connecting the electrical connector cable with a printed circuit board.

FIG. 9 is a schematic illustration showing a perspective view of an example of an electrical connector cable 400 according to a fourth embodiment of the present invention. FIG. 9 particularly illustrates a method for connecting the electrical connector cable 400 with a printed circuit board 12. As illustrated, the electrical connector cable 400 includes, in addition to the electrical connector cable 300 according to the third embodiment: an alignment plate 41 for in-plane aligning the contact bumps 6 of the terminal plane 5 with the electrode pads 13. The alignment plate 41 has a pair of alignment bosses 42. The first elastic sheet 21, the flexible harness 100, the printed circuit board 12 and the second elastic sheet 31 respectively have pairs of alignment holes 43, 44, 45 and 46 for receiving the pair of alignment bosses 42.

The method for connecting the electrical connector cable 400 with the electrode pads of an electric/electronic component (the electrode pads 13 of the printed circuit board 12 in FIG. 9) includes the steps of: aligning and positioning the contact bumps 6 of the flexible harness 100 so as to face the electrode pads 13 on a one-to-one basis by sequentially inserting the pair of alignment bosses 42 into the pairs of alignment holes 46, 45, 44 and 43; and performing the pushing and fastening operations similar to the third embodiment. It is preferred that the electrical connector cable 400 according to the fourth embodiment is equipped with the first elastic sheet 21 and the second elastic sheet 31. However, in such cases as described above in the third embodiment, the first elastic sheet 21 and the second elastic sheet 31 may be removed.

There is no particular limitation on the material for the alignment plate 41. However, for example, ABS resins which are suitable for precision fabrication processes can be advantageously used in order to accurately align the densely-pitched contact bumps 6 with the densely-pitched electrode pads 13. The alignment holes 43, 44, 45 and 46 can be formed by molding or the like.

Next, the effects and advantages of the electrical connector cable 400 according to the fourth embodiment will be described. As described above, the electrical connector cable 400 includes the alignment plate 41 in addition to the electrical connector cable 300 (or 301) according to the third embodiment. The use of the alignment plate 41 enables accurate and simple alignment of the contact bumps 6 with the electrode pads 13. Hence, the attachment and detachment of the flexible harness 100 can be simplified, thus simplifying the exchange of electric/electronic components and also facilitating assembly of electric/electronic apparatuses.

INDUSTRIAL APPLICABILITY

As described above, the invented flexible harness and the invented electrical connector cable using the invented flexible harness can be detachably connected to an electric/electronic device. Specifically, the end region of the conductor pattern of the flexible harness can be stably attached to and detached from the electrode pads of the electric/electronic component without using a conventional receptacle. The invented flexible harness and electrical connector cable can be used, for example, to connect different printed circuit boards or to connect different electronic components on the same printed circuit board. The invented flexible harness and electrical connector cable are particularly suitable for wiring a high-speed transmission cable between elements positioned at different heights or between movable elements.

Figure 10:
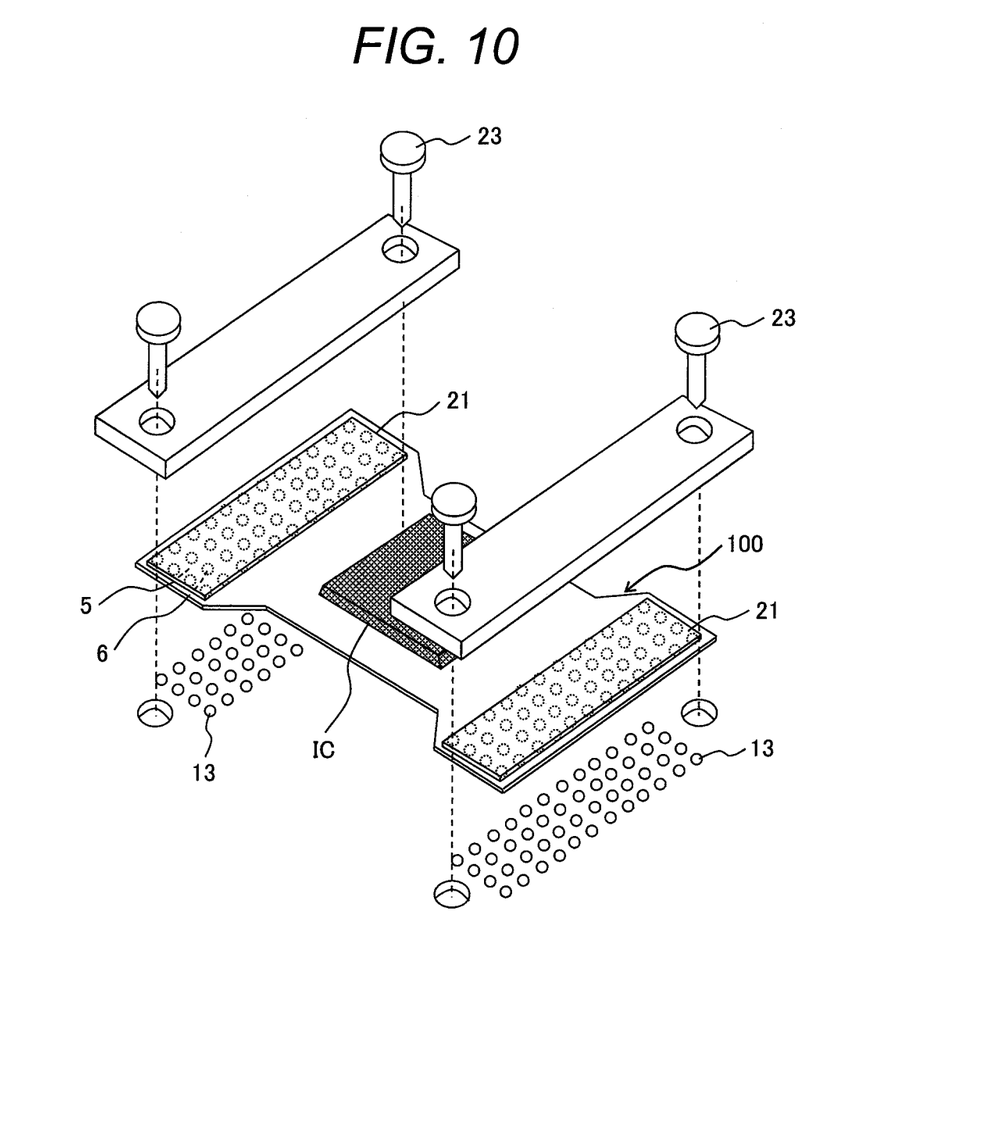
FIG. 10 is a schematic illustration showing a perspective view depicting that an electrical connector cable according to the present invention is used to connect an IC chip and a printed circuit board.
Figure 11:
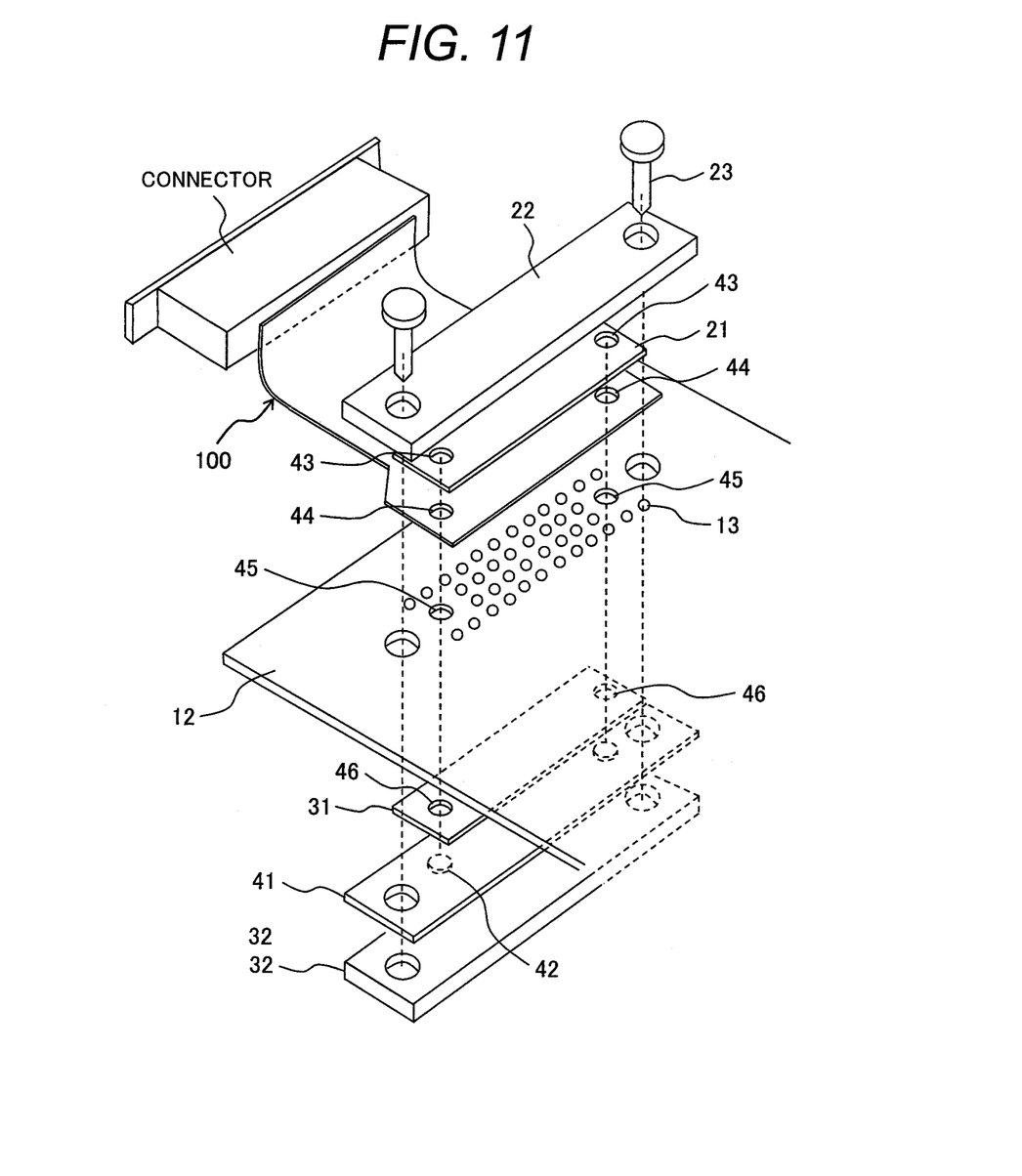
FIG. 11 is a schematic illustration showing a perspective view depicting that an electrical connector cable according to the present invention is used to connect a connector and a printed circuit board.

Specific examples include an electrical connector cable for connecting an IC chip and a printed circuit board (see FIG. 10) and an electrical connector cable for connecting a connector and a printed circuit board (see FIG. 11). FIG. 10 is a schematic illustration showing a perspective view depicting that an electrical connector cable according to the present invention is used to connect an IC chip and a printed circuit board; and FIG. 11 is a schematic illustration showing a perspective view depicting that an electrical connector cable according to the present invention is used to connect a connector and a printed circuit board.

Although the present invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A flexible harness adapted to be detachably connected to electrode pads of an electric/electronic component, the flexible harness comprising:
   a flexible insulator film;
   a conductor pattern formed on the flexible insulator film;
   a terminal plane which is an end region of the conductor pattern; and
   ball-like contact bumps formed on the terminal plane, each contact bump including a core made of an elastically deformable resin and an electrical conductor layer surrounding the core such that a detachable connection will be formed between the ball-like contact bumps and electrode pads of an electric/electronic component and the detachable connection will be free of a solder connection between the ball-like contact bumps and the electrode pads,
   wherein the ball-like contact bumps are fixed to the terminal plane by soldering, and a solder connection between at least one ball-like contact bump of the ball-like contact bumps and the terminal plane is thicker than at least one other solder connection between at least one other ball-like contact bump of the ball-like contact bumps and the terminal plane.

2. The flexible harness according to claim 1, wherein the conductor pattern includes:
   a plurality of signal lines formed on one surface of the insulator film, the plurality of signal lines being adapted to be electrically connected to the electrode pads of the electric/electronic component; and
   a ground line formed on the other surface of the insulator film.

3. The flexible harness according to claim 1, wherein the electrical conductor layer comprises a plurality of layers.

4. The flexible harness according to claim 1, wherein the resin of the core is a thermosetting phenol resin.

5. A module comprising a plurality of electric/electronic components electrically connected to one another via the flexible harness according to claim 1.

6. The flexible harness according to claim 1, wherein the electrical conductor layer includes a nickel underlayer and a gold contact layer, and the underlayer is disposed between the core and the contact layer.

7. An electrical connector cable adapted to be detachably connected to electrode pads of an electric/electronic component, the electrical connector cable comprising:
   a flexible harness including:
   a flexible insulator film;
   a conductor pattern formed on the flexible insulator film;
   a terminal plane which is an end region of the conductor pattern; and
   ball-like contact bumps formed on the terminal plane, each contact bump including a core made of an elastically deformable resin and an electrical conductor layer surrounding the core, wherein the ball-like contact bumps are fixed on the terminal plane by solder, and a solder connection between at least one ball-like contact bump of the ball-like contact bumps and the terminal lane is thicker than at least one other solder connection between at least one other ball-like contact bump of the ball-like contact bumps and the terminal plane;
   a first sheet disposed adjacent to the surface of the insulator film opposite the surface including the terminal plane, the first sheet being made of an elastic material with a low modulus of elasticity;
   a first plate which is disposed over the first sheet and is for pushing together the first sheet and the terminal plane against the electrode pads, the first plate being made of a rigid material with a high modulus of elasticity; and
   a fastening jig for fastening together the first plate, the first sheet, the contact bumps on the terminal plane, and the electrode pads on the electric/electronic component,
   wherein a detachable connection will be formed between the ball-like contact bumps and the electrode pads of the electric/electronic component and the detachable connection will be free of a solder connection between the ball-like contact bumps and the electrode ads.

8. The electrical connector cable according to claim 7, further comprising:
   a second sheet disposed adjacent to the surface of the electric/electronic component opposite the surface including the electrode pads, the second sheet being made of an elastic material with a low modulus of elasticity; and
   a second plate for pushing together the second sheet and the electrode pads against the terminal plane, the second plate being made of a rigid material with a high modulus of elasticity.

9. The electrical connector cable according to claim 7, wherein at least one of the first plate and the second plate is a leaf spring.

10. The electrical connector cable according to claim 7, further comprising an alignment plate for aligning the contact bumps with the electrode pads.

11. A module comprising a plurality of electric/electronic components electrically connected to one another via the electrical connector cable according to claim 7.

12. An assembly between a flexible harness and electrode pads of an electric/electronic component, the assembly comprising:
   a flexible harness having a flexible insulator film, a conductor pattern formed on the flexible insulator film, a terminal plane as an end region of the conductor pattern, and ball-like contact bumps fixed on the terminal plane, wherein each contact bump of the ball-like contact bumps includes a core made of an elastically deformable resin and an electrical conductor layer surrounding the core, wherein the ball-like contact bumps are fixed on the terminal plane by solder, and a solder connection between at least one ball-like contact bump of the ball-like contact bumps and the terminal plane is thicker than at least one other solder connection between at least one other ball-like contact bump of the ball-like contact bumps and the terminal plane;
   an electric/electronic component having electrode pads;
   a detachable electrical connection between the ball-like contact bumps and the electrode pads, wherein the detachable electrical connection is free of a solder connection between the ball-like contact bumps and the electrode pads.

13. The assembly according to claim 12, wherein at least one ball-like contact bump of the ball-like contact bumps is larger than at least one other ball-like contact bump of the ball-like contact bumps, and at least one ball-like contact bump of the ball-like contact bumps is subject to elastic deformation and absorbs a height difference between the ball-like contact bumps in the detachable electrical connection.

14. The assembly according to claim 12, wherein the electrical conductor layer comprises a plurality of layers.

15. The assembly according to claim 12, wherein the resin of the core is a thermosetting phenol resin.

16. The assembly according to claim 12, wherein the conductor pattern includes:
- a plurality of signal lines formed on one surface of the insulator film, the plurality of signal lines being electrically connected to the electrode pads of the electric/electronic component; and
- a ground line formed on the other surface of the insulator film.

17. The assembly according to claim 12, wherein the electrical conductor layer includes a nickel underlayer and a gold contact layer, and the underlayer is disposed between the core and the contact layer.

\* \* \* \* \*